United States Patent
Zhang et al.

(10) Patent No.: US 9,607,710 B2
(45) Date of Patent: Mar. 28, 2017

(54) READ-THRESHOLD CALIBRATION IN A SOLID STATE STORAGE SYSTEM

(71) Applicant: SK hynix memory solutions inc., San Jose, CA (US)

(72) Inventors: Fan Zhang, Fremont, CA (US); June Lee, Sunnyvale, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 14/936,340

(22) Filed: Nov. 9, 2015

(65) Prior Publication Data

US 2016/0133334 A1    May 12, 2016

Related U.S. Application Data

(60) Provisional application No. 62/077,604, filed on Nov. 10, 2014.

(51) Int. Cl.
| | |
|---|---|
| *G11C 16/00* | (2006.01) |
| *G11C 16/34* | (2006.01) |
| *G11C 11/56* | (2006.01) |
| *G11C 16/26* | (2006.01) |
| *G11C 29/02* | (2006.01) |

(52) U.S. Cl.
CPC ...... *G11C 16/3427* (2013.01); *G11C 11/5642* (2013.01); *G11C 16/26* (2013.01); *G11C 29/021* (2013.01); *G11C 29/028* (2013.01); *G11C 16/34* (2013.01)

(58) Field of Classification Search
CPC ..... G11C 16/3427; G11C 16/08; G11C 16/26; G11C 11/5642; G11C 16/34; G11C 16/3404; G11C 29/021; G11C 29/028
USPC .......... 365/185.02, 185.03, 185.24
See application file for complete search history.

(56) References Cited

U.S. PATENT DOCUMENTS

| | | | | |
|---|---|---|---|---|
| 7,729,165 B2* | 6/2010 | Wang | ...... | G11C 8/08 365/185.03 |
| 7,957,187 B2* | 6/2011 | Mokhlesi | ...... | G11C 11/5642 365/185.03 |
| 8,213,236 B1* | 7/2012 | Wu | ...... | G11C 7/04 365/185.24 |
| 8,934,306 B2* | 1/2015 | Shen | ...... | G11C 7/08 365/185.24 |
| 2012/0213001 A1* | 8/2012 | Yang | ...... | G06F 11/1048 365/185.2 |
| 2014/0036587 A1* | 2/2014 | Tannhof | ...... | G11C 16/0441 365/185.03 |
| 2014/0198567 A1* | 7/2014 | Mokhlesi | ...... | G11C 11/5642 365/185.03 |
| 2014/0233322 A1* | 8/2014 | Wu | ...... | G11C 16/3404 365/185.24 |

* cited by examiner

*Primary Examiner* — Tan T Nguyen
(74) *Attorney, Agent, or Firm* — IP & T Group LLP

(57) ABSTRACT

A read-threshold calibration method in a solid state storage system including measuring a threshold voltage distribution of solid state storage elements; determining a threshold voltage; decoding data according to the determined threshold voltage; filtering the threshold voltage distribution of solid state storage elements with a predetermined filter length when the decoding fails; changing the filter length; and repeating the determining, decoding, filtering, and changing steps with the changed filter length until the decoding is successful.

15 Claims, 11 Drawing Sheets

READ-THRESHOLD CALIBRATION IN A SOLID STATE STORAGE SYSTEM

CROSS-REFERENCE TO RELATED APPLICATIONS

This application claims priority to U.S. Provisional Patent Application No. 62/077,604 entitled "READ-THRESHOLD CALIBRATION BY ITERATIVE FILTERING" filed on Nov. 10, 2014, the contents of which are incorporated herein by reference for all purposes.

BACKGROUND

1. Field

Various exemplary embodiments of the present invention relate to a solid state storage system, and more particularly a read-threshold calibration in a solid state storage system.

2. Description of the Related Art

In NAND flash memory storage devices, information is stored in a cell by different charge levels in a cell. During write and read process, noise is introduced by program disturb and inter-cell interference charge leakage that causes the voltage level to drop over time, where the drop is proportional to the amount of charge stored as well as the number of program and erase (P/E) cycles a cell has experienced. Since the noise varies across cells, cells intended to be written to the same voltage level exhibit certain voltage distribution when read back. Usually, the distribution from a higher intended voltage level will drift down and broaden as time passes due to the charge leaking effect, potentially overlapping a part of the distribution from a lower intended voltage level. This drifting and broadening phenomenon is more severe for smaller fabrication process nodes. Consequently, discerning cells that belong to a particular distribution becomes increasingly difficult as NAND flash memory vendors aggressively shrink the fabrication process nodes to increase storage density and reduce cost.

For hard-read NAND flash memory storage devices, reading back the stored information involves comparing the cell voltage against a set of thresholds. In SLC (Single-Level Cell) devices, the read back value of a bit (either 0 or 1) is solely based on whether the cell voltage is above or below a single threshold. (The term "hard-read" refers to the fact that the read back values are either 0 or 1. This is in contrast to the term "soft-read", where the read back values can take on a range of numbers for representing the cell voltage in a fine resolution.) Ideally, the thresholds should be chosen to minimize the number of bit errors due to two potentially overlapping distributions. However, this is not an easy task as the distributions, which are a function of the intended voltage levels, the number of P/E cycles the cells have gone through, and the data retention period (i.e., the period of time elapsed between writing and reading the data), are not known in advance. Hence, setting the thresholds properly to minimize bit error rate (BER) in an adaptive manner is a critical component in ensuring data reliability in modern NAND flash memory storage devices. In various embodiments, a number of techniques may be used to estimate of optimal threshold. However, in some cases the threshold found by the optimal threshold estimation process may be greatly inaccurate to the real optimal threshold. An improved read-threshold calibration technique using the iterative filtering technique is described herein. The proposed scheme can provide more accurate estimate of the optimal threshold.

Some techniques for locating the optimal threshold try to measure the cell level distribution and use the minimum as the threshold. A drawback to this is that the threshold may be greatly inaccurate to the optimal threshold. In FIG. 1, the distribution is measured from a multi-level cell (MLC) device where two bits are stored per cell. It may be clear that the measured cell level distribution includes a large amount of noise. In this case, techniques which use a minimum will be trapped at some local minimal points and hence far away from the global minimum point.

One previous idea for addressing the (wrong) local minimum points was to increase the step size when measuring the distribution. However, changing the step size does not eliminate those local minimum points. The measurement results using 2×, 3×, 4× and 5× step size are shown in FIG. 2 to FIG. 6. As shown, down-sampling the distribution does not resolve concerns.

The technique described herein aims to fix this weakness.

SUMMARY

Aspects of the invention include a read-threshold calibration method in a solid state storage system. The method may include measuring a threshold voltage distribution of solid state storage elements; determining a threshold voltage; decoding data according to the determined threshold voltage; filtering the threshold voltage distribution of solid state storage elements with a predetermined filter length when the decoding fails; and repeating the determining, decoding, filtering, and changing steps with the changed filter length until the decoding is successful.

Further aspects of the invention may include a system including solid state storage elements; a read-threshold calibrator; and an interface suitable for communicating with the solid state storage element and the read-threshold calibrator; the read-threshold calibrator suitable for: measuring a threshold voltage distribution of the solid state storage elements; determining a threshold voltage; decoding data according to the determined threshold voltage; filtering the threshold voltage distribution of solid state storage elements with a predetermined filter length when the decoding fails; changing the filter length; and repeating the determining, decoding, filtering, and changing with the changed filter length until the decoding is successful.

Additional aspects of the invention include a computer implemented process. The process may include computer instructions for: measuring a threshold voltage distribution of solid state storage elements; determining a threshold voltage; decoding data according to the determined threshold voltage; filtering the threshold voltage distribution of solid state storage elements with a predetermined filter length when the decoding fails; changing the filter length; and repeating the determining, decoding, filtering, and changing steps with the changed filter length until the decoding is successful.

DETAILED DESCRIPTION

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The terminology used herein is for describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, indicate the presence of stated features, but do not preclude the presence or addition of one or more other features.

Figure 1:
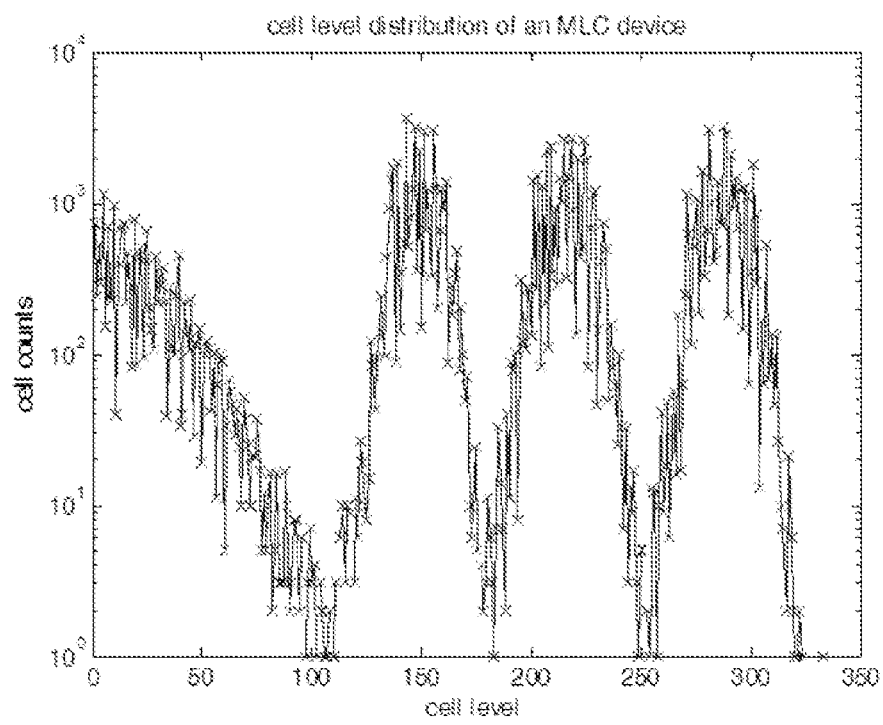
FIG. 1 is a graph showing an example of MLC distribution.
Figure 2:
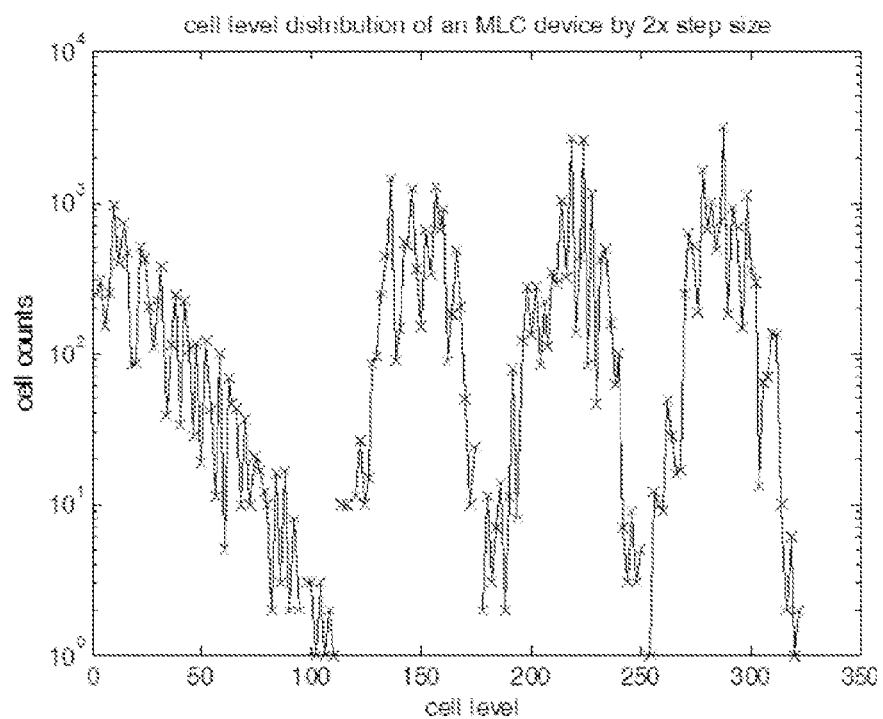
FIGS. 2, 3, 4, and 5 are graphs showing the measurement results using 2×, 3×, 4× and 5× step size.
Figure 3:
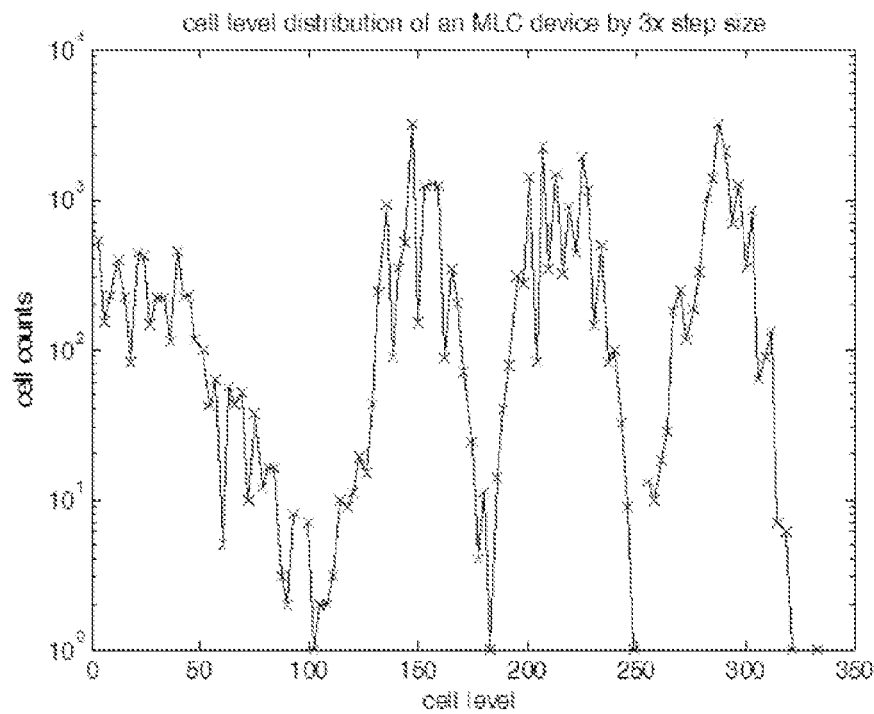
Figure 4:
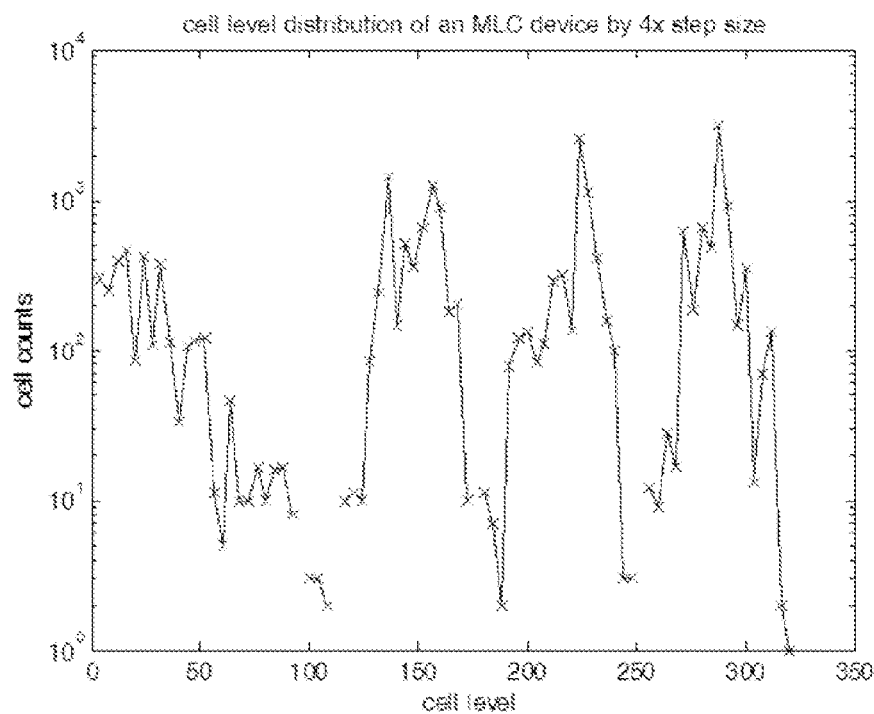
Figure 5:
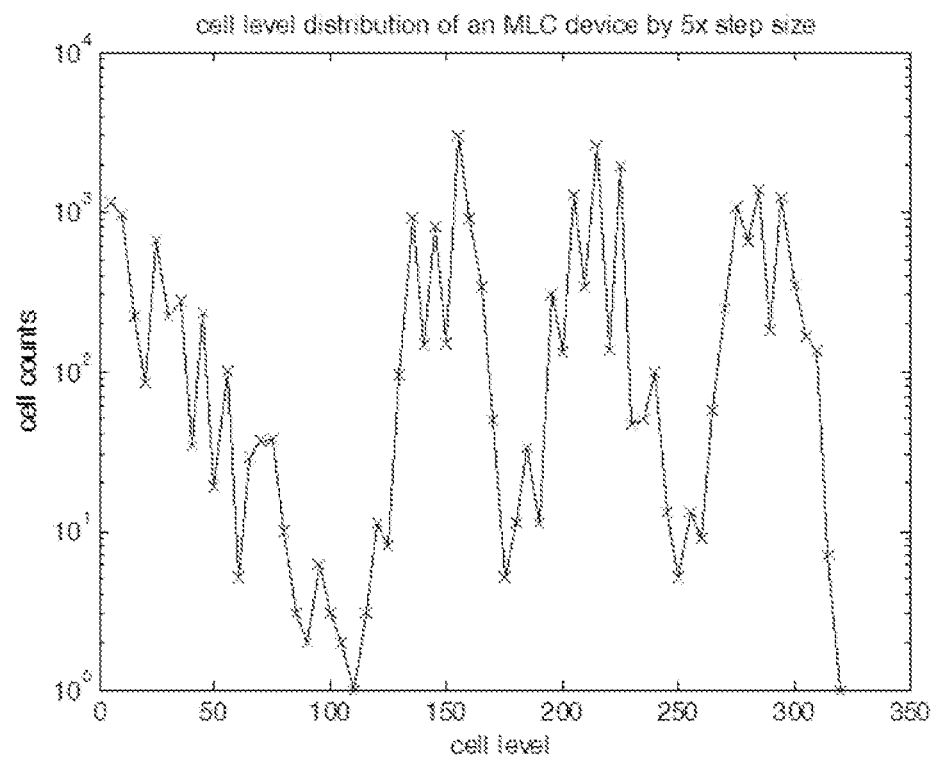
Figure 6:
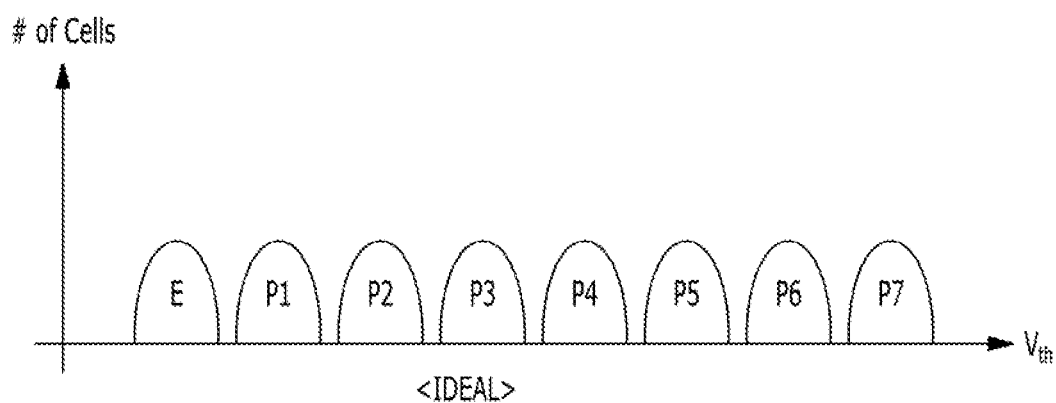
FIG. 6 is a diagram showing threshold voltage distributions.
Figure 7:
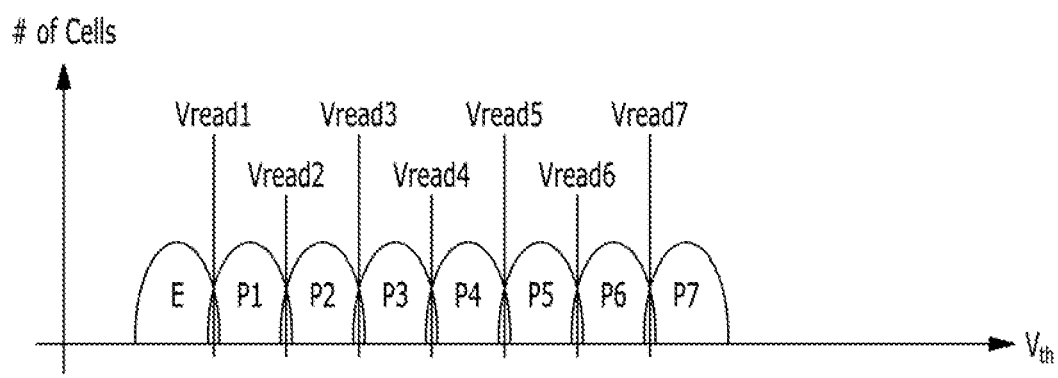
FIG. 7 is a diagram showing shifted threshold voltage distributions.

Referring to FIG. 6, a threshold voltage distribution schematically illustrating program and erase states of a 3-bit MLC solid state memory device is shown. In FIG. 7, there is shown a threshold voltage distribution schematically illustrating program and erase states due to characteristic deterioration of the 3-bit MLC solid state memory device.

In an MLC solid state memory device (e.g., an MLC flash memory device capable of storing k-bit data in a single memory cell) the memory cell may have one of $2^k$ threshold voltage distributions. For example, the 3-bit MLC has one of eight threshold voltage distributions.

Threshold voltages of memory cells programmed for the same data form the threshold voltage distribution due to characteristic differences between memory cells. In the 3-bit MLC solid state memory device, as illustrated in FIG. 6, threshold voltage distributions are formed in correspondence with the data states including 7 program states 'P1' to 'P7' and an erase state 'E'.

FIG. 6 shows an ideal case in which threshold voltage distributions do not overlap and have sufficient read voltage margins between. Referring to the flash memory example of FIG. 7, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 7, the threshold voltage distribution may be shifted due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 7.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 7, read data may include a significant number of errors.

Figure 8:
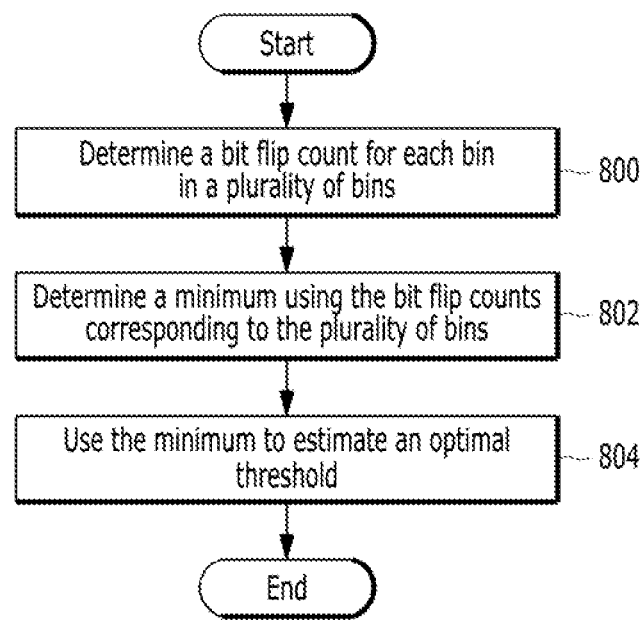
FIG. 8 is a flowchart illustrating an embodiment of a method for estimating an optimal threshold.

Referring next to FIG. 8, a flowchart of steps for estimating an optimal threshold is shown. When a read is performed on a solid state storage system, one or more thresholds are used to perform the read. For example, in single-level cell (SLC) systems (where a cell stores a single bit), a single threshold is used to perform a read. If a given cell has a voltage which is less than the threshold, then a value of 1 is read. If the voltage stored by the cell is greater than the threshold, then a value of 0 is read. The threshold that returns the fewest bit errors (e.g., when the read-back bit sequence is compared to the correct or actual bit sequence) is referred to as the optimal threshold and the process of FIG. 8 estimates the value of the optimal threshold.

At block 800, a bit flip count is determined for each bin in a plurality of bins. The bit flip count may be determined by (1) performing a first read on a group of solid state storage cells at a first threshold that corresponds to a lower bound for a given bin and (2) performing a second read on the same group of solid state storage cells at a second threshold that corresponds to an upper bound for the given bin. The bit flip count is calculated based on the read back values from the first read at (1) and the second read at (2).

Figure 9:
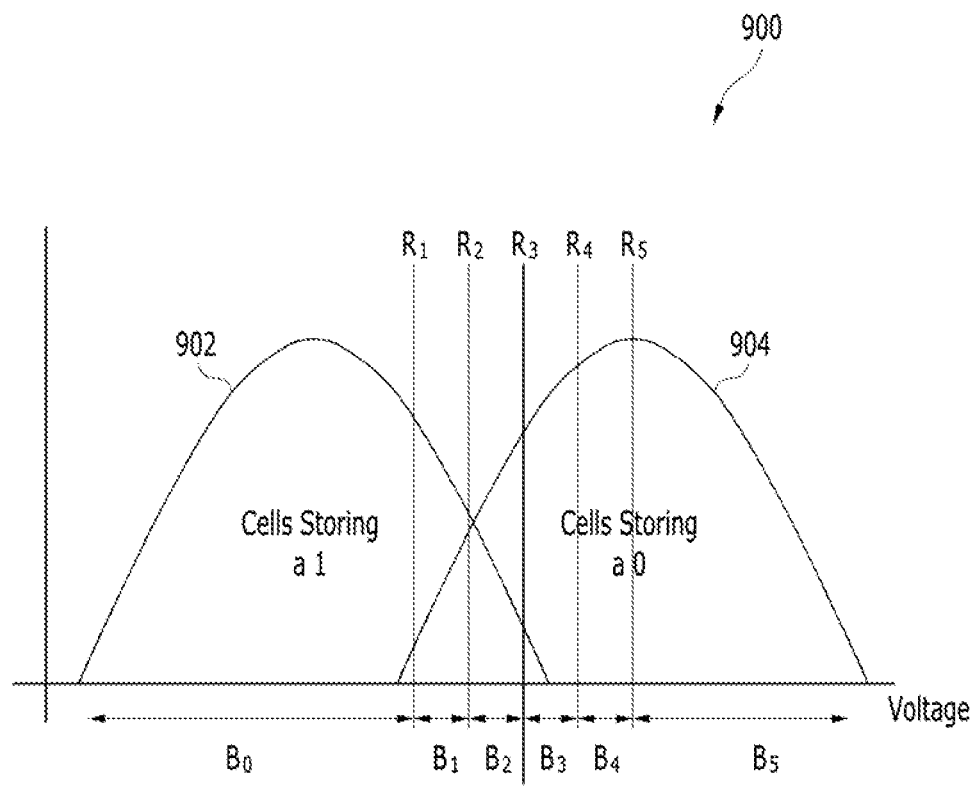
FIGS. 9A and 9B are diagram showing an embodiment of SLC distributions.

See, for example, FIGS. 9A and 9B, which are diagrams showing an embodiment of SLC distributions. The method of FIG. 8 may be performed in order to estimate the voltage at which distribution 902 and distribution 904 intersect, since the optimal threshold corresponds to the voltage at which two distributions intersect. In diagram 900, distribution 902 corresponds to cells correctly storing a 1 and distribution 904 corresponds to cells correctly storing a 0. Any bit mapping may be used and the bit mappings described herein are merely exemplary.

In diagram 900, for each of bins B1-B4 a corresponding bit flip count would be determined. To determine the bit flip count for bin B1, a first read is performed at threshold voltage R1 and a second read is performed at threshold voltage R2. If any of the bits flip (i.e., change) between the read at threshold voltage R1 and threshold voltage R2, then the bit flip count is incremented.

Diagram 950 shows exemplary read-back bit sequences which are returned by the reads at threshold voltage R1 and threshold voltage R2. In this example, the group of cells being read contains four cells. The read-back values for cell 1 and cell 4 are consistently a 0 and a 1 and thus do not correspond to bit flips such that the bit flip count is not incremented.

In some embodiments, only plausible or expected bit flips are counted at step 800 in FIG. 8. For example, referring to the read-back values of cell 2 in diagram 950, a value of 0 is returned by the read of cell 2 at threshold voltage R1. Therefore, it can be inferred that cell 2 is storing a voltage which is greater than R1 (i.e., stored-voltage (cell 2)>R1). The read of cell 2 at threshold voltage R2 returned a 1, which corresponds to cell 2 storing a voltage which is less than R2 (i.e., stored-voltage (cell 2)<R2). These two inequalities are not incompatible, since the range R1<stored-voltage (cell 2)<R2 satisfies both inequalities. This is one example of a plausible bit flip.

In contrast, the bit flip shown by cell 3 is implausible. A returned value of 1 at threshold voltage R1 corresponds to a stored voltage which is less than R1 (i.e., stored-voltage (cell 3)<R1). However, the returned value of 0 at threshold voltage R2 corresponds to a stored voltage which is greater than R2 (i.e., stored-voltage (cell 3)>R2). There is no value of stored-voltage (cell 3), which satisfies both inequalities because the value cannot be both less than R1 and greater than R2. This is one example of an implausible bit flip and in some embodiments such implausible bit flips are not counted at step 800 in FIG. 8.

Oftentimes, implausible bit flips are due to read noises and if two threshold voltages (e.g., R1 and R2) are sufficiently separated implausible bit flips will not occur. Therefore, in some embodiments, there is no differentiation between the plausible and implausible bit flips. All the bit flips are counted in such embodiments.

Returning to FIG. 8, at step 802, a minimum (e.g., a minimum bit, a minimum bin, etc.) is determined using the bit flip counts corresponding to the plurality of bins. At step 804, the minimum (e.g., minimum bit, minimum bin, etc.) is used to estimate an optimal threshold. Steps 802 and 804 are described in detail with reference to FIGS. 9A-11 below.

Although the subscript numbering of placed thresholds (i.e., R1-R5) shown in FIG. 9A and other figures may imply a certain sequence or ordering of reads (e.g., from left to right), this is merely for illustrative purposes. Any sequence or ordering of reads may be performed as will be understood to those of skill in the art from the disclosure herein. For example, the read at threshold voltage R2 may be performed first and the read at threshold voltage R1 may be performed second if desired.

Figure 10:
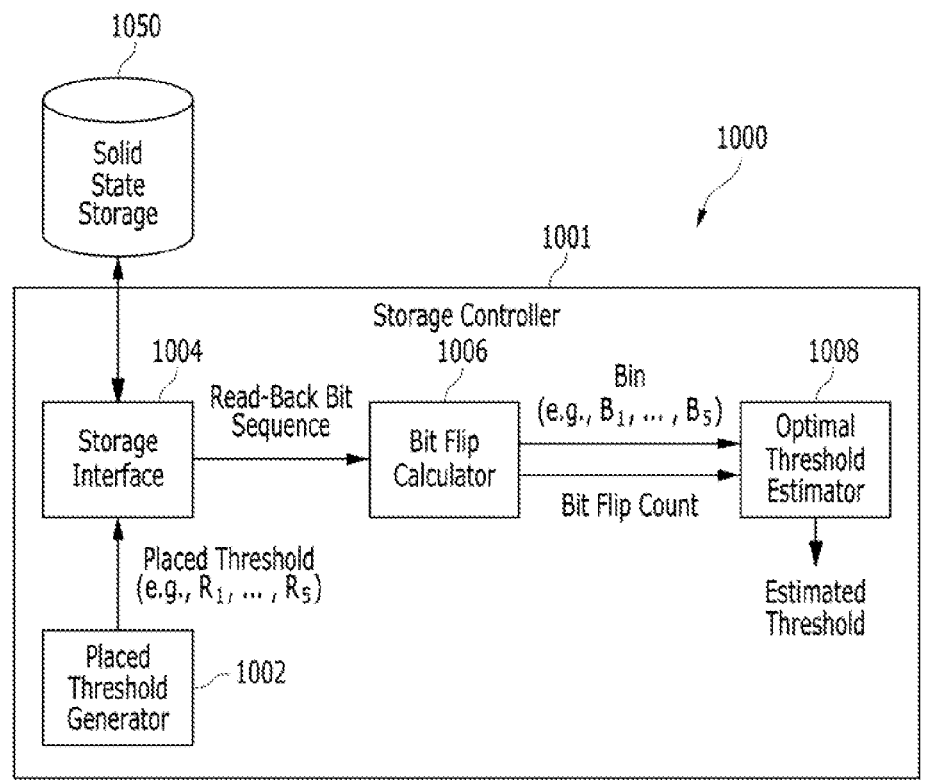
FIG. 10 is a diagram illustrating an embodiment of a storage controller which performs optimal threshold estimation.

FIG. 10 is a diagram illustrating embodiment system 1000 including a storage controller 1001 and a solid state storage 1050. The storage controller 1001 may perform optimal threshold estimation. In some embodiments, a storage controller 1001 is implemented on a semiconductor device, such as an application-specific integrated circuit (ASIC) or a field-programmable gate array (FPGA). In some embodiments, the storage controller 1001 includes a first semiconductor device (i.e., a first "chip") and a solid state storage 1050 includes a second semiconductor device (i.e., a second "chip"). In some embodiments, a single storage controller manages multiple "chips" of solid state storage.

The system 1000 may include a solid state storage 1050. In one example, the solid state storage 1050 includes NAND Flash. In various embodiments, the solid state storage 1050 includes SLC storage where a cell stores 1 bit, multi-level cell (MLC) storage where a cell stores 2 bits, or tri-level cell (TLC) storage where a cell stores 3 bits. In some embodiments, the solid state storage 1050 includes multiple types of storage (e.g., SLC storage as well as MLC storage).

In the example shown, the storage controller 1001 may include a placed threshold generator 1002 that generates placed thresholds. Referring to diagram 900 in FIG. 9A as an example, the placed threshold generator 1002 generates placed thresholds R1-R5. In some embodiments, the placed threshold generator 1002 includes one or more programmable bin parameters which are used to generate the placed thresholds. In one example, the bin parameters include a bin width (e.g., $\Delta$, a number of bins to generate (N), and a default threshold (R(default)). For example, if $\Delta=10$, N=5, and R(default)=78, then placed thresholds at 53, 63, 73, 83, 93, and 103 would be generated. The exemplary placed thresholds correspond to five bins, each with a width of ten units, where the center bin (i.e., the [73, 83] bin) has a center at the default threshold of 78.

The storage controller 1001 may include a storage interface 1004. The storage interface 1004 receives the placed thresholds from the placed threshold generator 1002 and performs reads on the solid state storage 1050 using the placed thresholds.

The storage controller 1001 may include a bit flip calculator 1006 and an optimal threshold estimator 1008. The storage interface 1004 may pass the read-back bit sequences to bit flip calculator 1006. Diagram 950 in FIG. 9B shows one example of read-back bit sequences. The bit flip calculator 1006 calculates the bit flip count for each bin and passes the bins (e.g., B1-B5) and corresponding bit flip counts to the optimal threshold estimator 1008. The optimal threshold estimator 1008 in turn generates an estimated threshold, including by determining a minimum (e.g., a minimum bit, a minimum bin, etc.).

In a first example described below, a minimum bin, which corresponds to the bin having the lowest bit flip count, is selected and is used to generate the estimated threshold. In a second example described below, a curve is fitted to data points corresponding to or otherwise based on the bit flip counts and the minimum of the fitted curve is used to estimate the optimal threshold.

Figure 11:
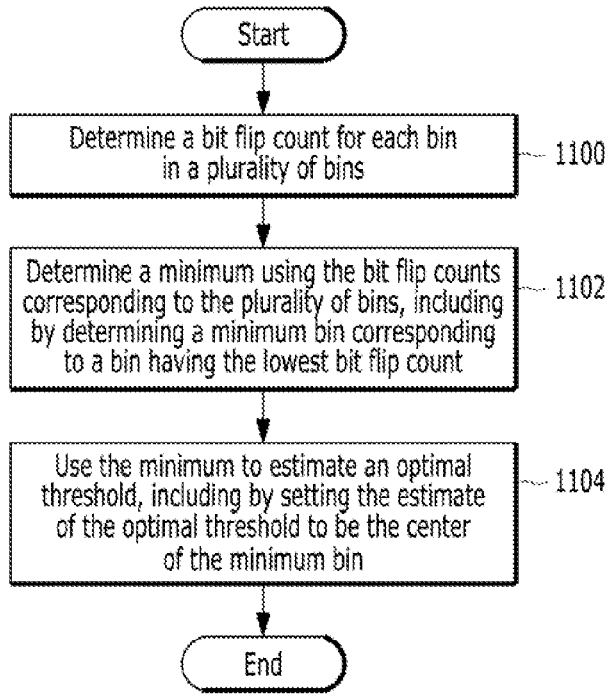
FIG. 11 is a flowchart illustrating steps for estimating an optimal threshold using a minimum bin.

FIG. 11 is a flowchart of steps for estimating an optimal threshold using a minimum bin. At step 1100, a bit flip count is determined for each bin in a plurality of bins. The bit flip count may be determined by (1) performing a first read on a group of solid state storage cells at a first threshold that corresponds to a lower bound for a given bin and (2)

performing a second read on the group of solid state storage cells at a second threshold that corresponds to an upper bound for the given bin.

At step 1102, a minimum is determined using the bit flip counts corresponding to the plurality of bins. The minimum may be determined by determining a minimum bin corresponding to a bin having the lowest bit flip count.

Returning to FIG. 11, at step 1104, the minimum is used to estimate an optimal threshold. The minimum may be used to estimate an optimal threshold by setting the estimate of the optimal threshold to be the center of the minimum bin.

Figure 12:
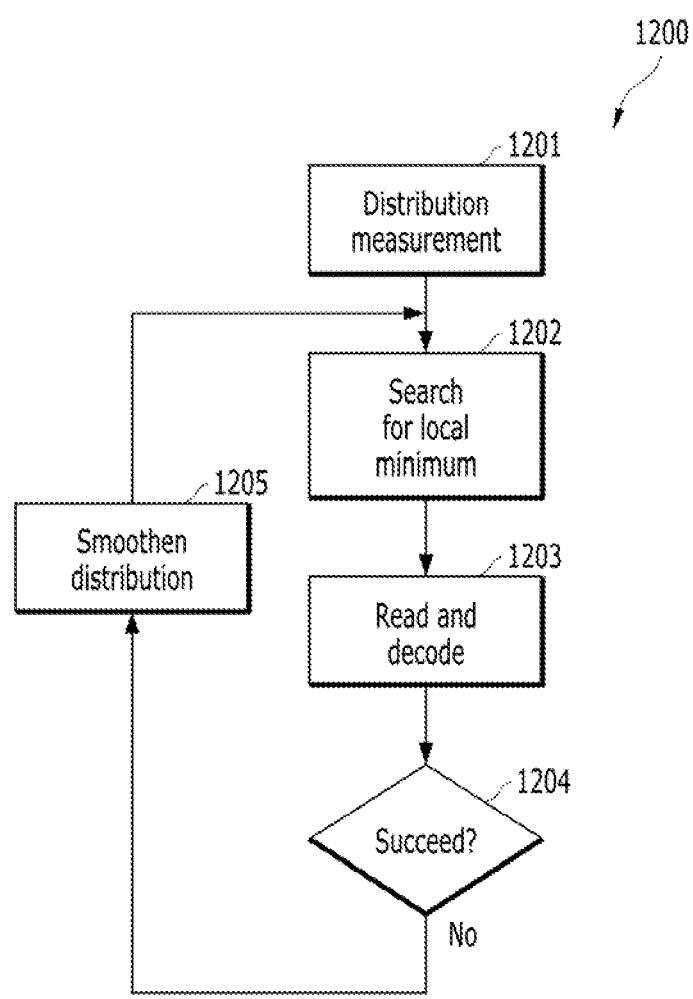
FIG. 12 is a flowchart illustrating steps for obtaining the improved read threshold voltage distributions.

FIG. 12 is a flowchart 1200 of steps for obtaining the improved read threshold voltage distributions. When read-threshold calibration is triggered, the following steps are performed.

At step 1201, the threshold voltage distributions of memory cells is measured. The step 1201 may be performed by reading the memory cells using a number of read threshold voltages.

At step 1202, the threshold voltage is determined. The method for determining the threshold, for example, may be performed by searching the local minimum points and outputting the threshold voltage, as described in FIG. 8 and FIG. 11 above.

At step 1203, a decoding according to the threshold voltage is performed. For example, the step 1203 may be performed by using the threshold voltage as either hard read or soft read threshold voltage, and reading and decoding the data.

At step 1204, if the decoding is successful, the process is terminated and success is reported.

At step 1205, the threshold voltage distribution of solid state storage elements is smoothened if the decoding fails. A filter may be used with a filter length in the range of two to eight to filter the distribution. The filter length may be increased and then, steps 1202, 1203, and 1204 may be repeated until the decoding succeeds. The filter length may be increased, for example, by 1 for each iteration of the method 1200.

Figure 13:
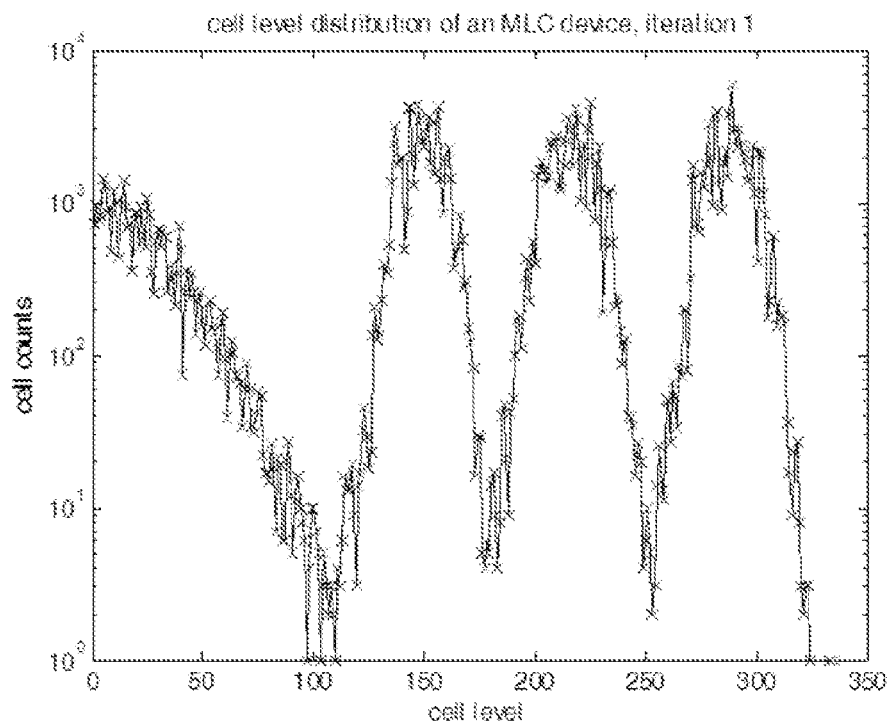
FIGS. 13, 14, 15, 16, 17, 18, 19, and 20 are graphs showing the filtered distributions by using different filter lengths.
Figure 14:
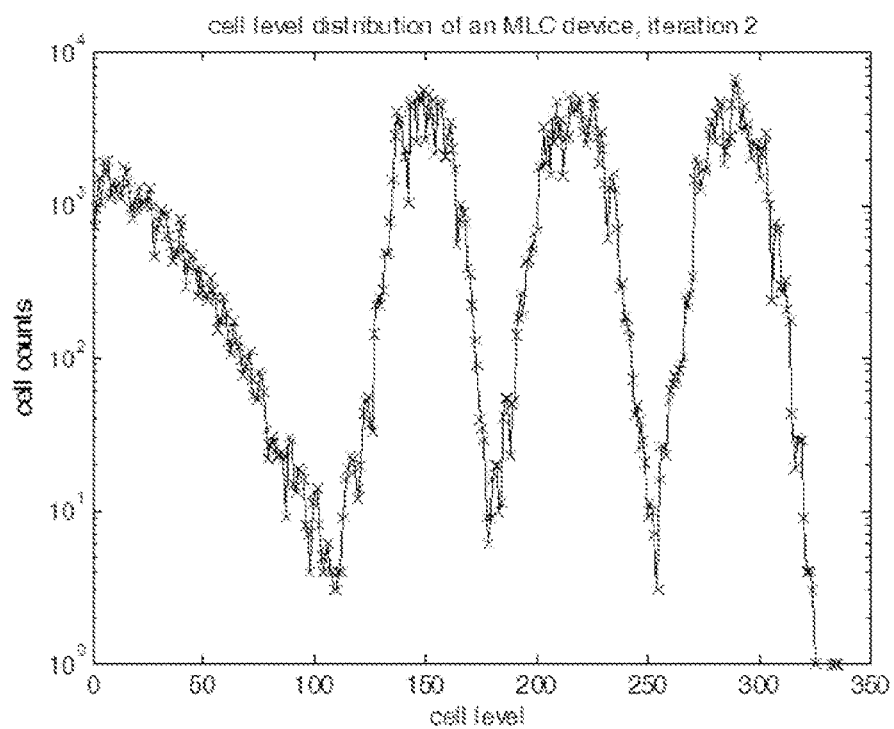
Figure 15:
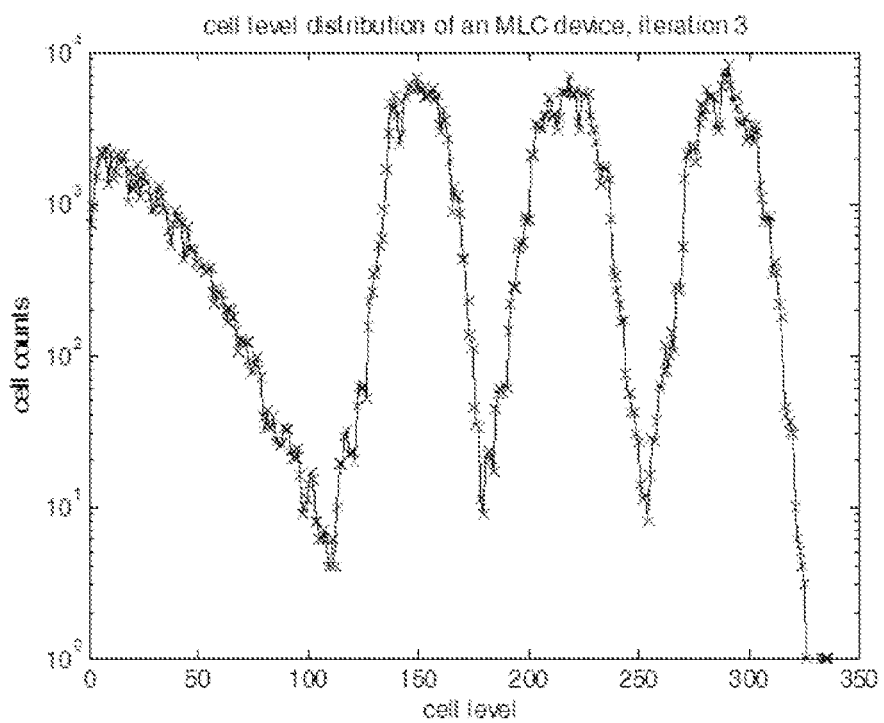
Figure 16:
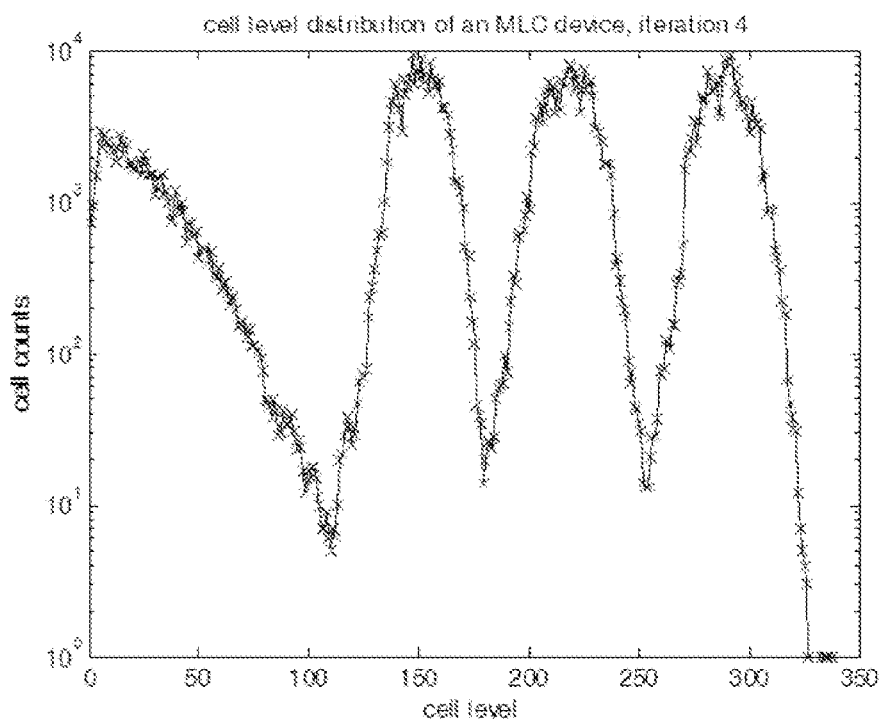
Figure 17:
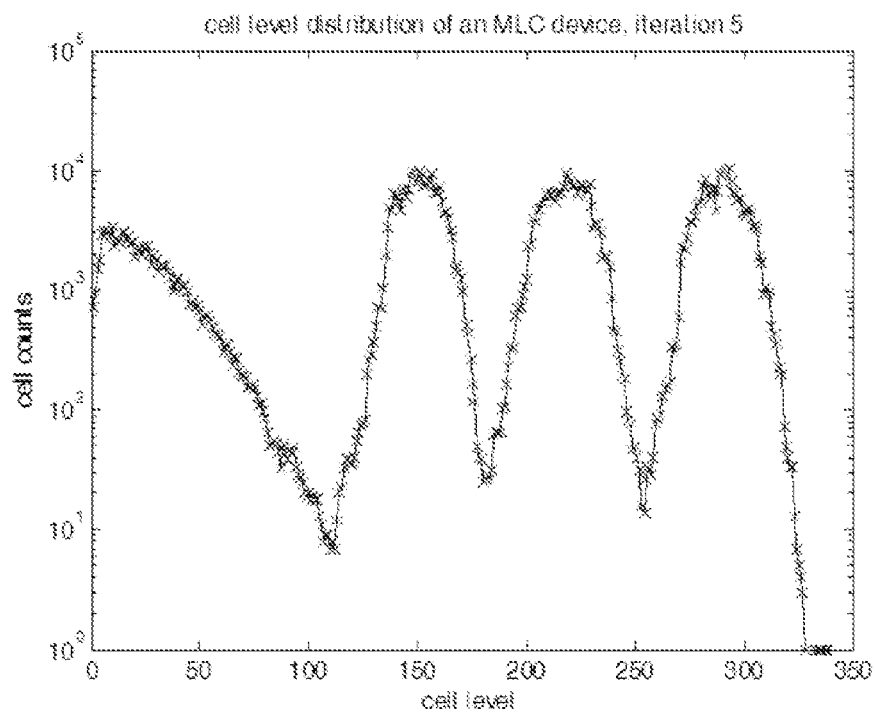
Figure 18:
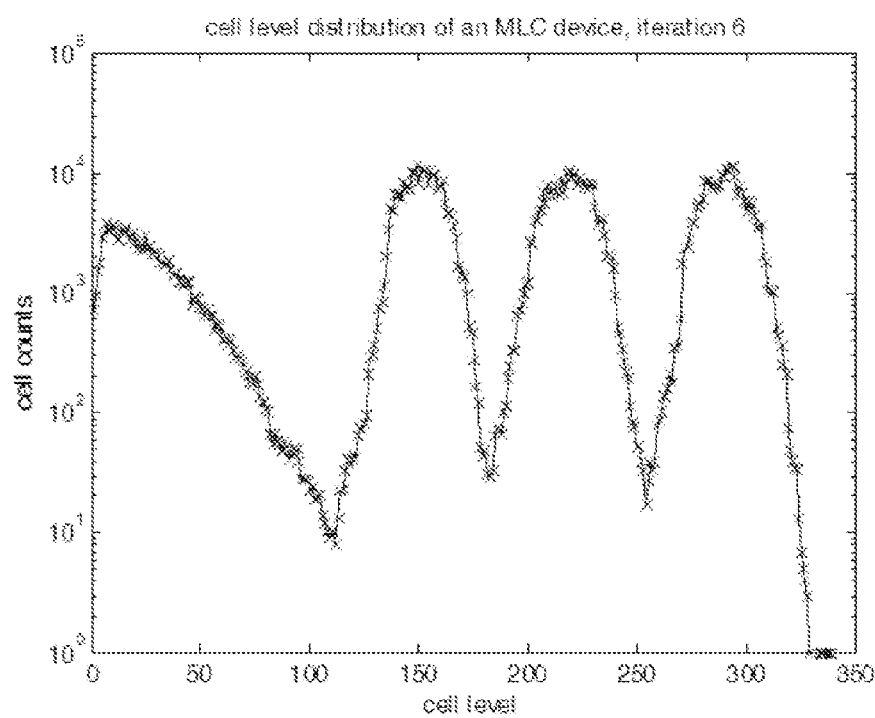
Figure 19:
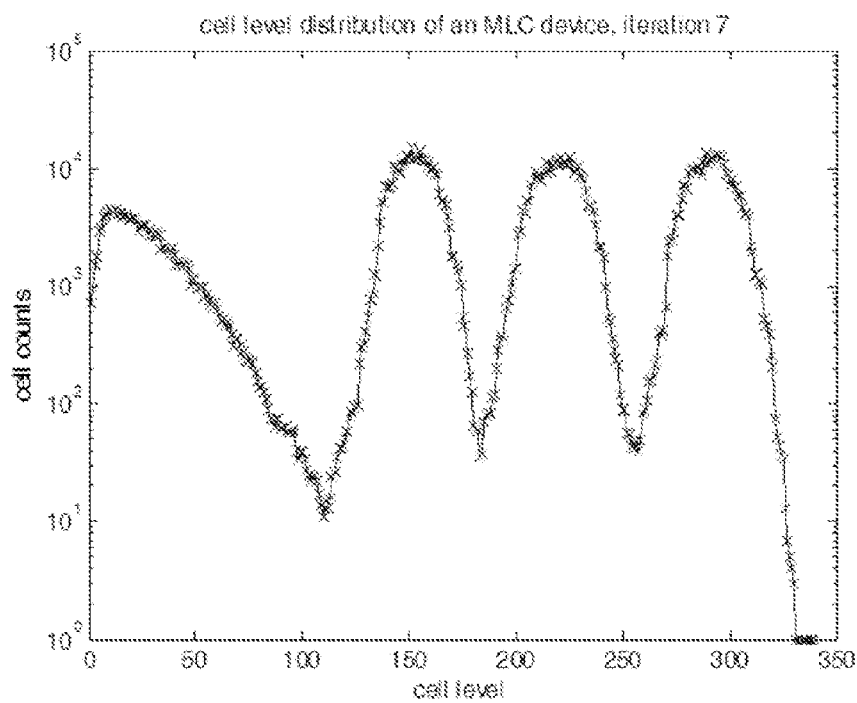
Figure 20:
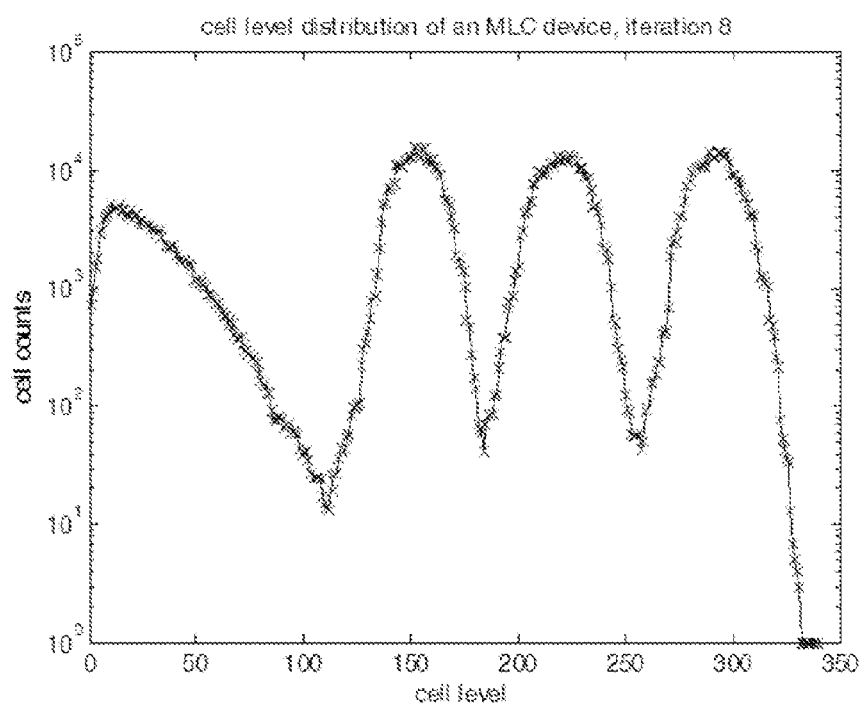

FIGS. 13 to 20 show the filtered distributions by using different filter lengths. As shown, FIG. 13 shows a first iteration, FIG. 14 shows a second iteration, and so forth such that FIG. 20 shows an eighth iteration. As depicted, filtering may remove the excessive number of local minimum points and help the optimal threshold estimation techniques find better thresholds (i.e., closer to the global minimum and closer to the actual optimal threshold). Filtering may also help remove the noise on the distribution. In some embodiments, filtering may remove some detailed information about the distribution, thus, a shorter filter length may be used in earlier iterations. If decoding still fails, the longer filter may be used.

The proposed technique can be used in SLC, MLC and TLC (tri-level cell) devices. The technique can be used for both hard decoding and soft decoding. The technique can also be applied to different kinds of ECCs, including LDPC codes, BCH codes and TPC (turbo product codes) codes.

While the present invention has been described with respect to the specific embodiments, it will be apparent to those skilled in the art that various changes and modifications may be made without departing from the spirit and scope of the invention as defined in the following claims.

What is claimed is:

1. A read-threshold calibration method in a solid state storage system, comprising:
   measuring, with a controller, a threshold voltage distribution of solid state storage elements;
   locating, with the controller, a first minimum point of the threshold voltage distribution;
   estimating, with the controller, a first optimal read threshold based on the located first minimum point;
   decoding, with the controller, data using the estimated first optimal read threshold;
   if decoding fails:
   removing, with the controller, an excessive number of minimum points from the threshold voltage distribution by filtering the threshold voltage distribution of the solid state storage elements;
   locating, with the controller, a subsequent minimum point of the filtered threshold voltage distribution;
   estimating, with the controller, a subsequent optimal read threshold based on the located subsequent minimum point; and
   decoding, with the controller, the data that previously failed to decode using the estimated subsequent optimal read threshold.

2. The read-threshold calibration method in a solid state storage system according to claim 1, wherein the excessive number of minimum points are removed from the threshold voltage distribution by filtering with a filter length in a range of two to eight.

3. The read-threshold calibration method in a solid state storage system according to claim 2, further comprising changing the filter length if decoding fails.

4. The read-threshold calibration method in a solid state storage system according to claim 1, wherein the measuring the threshold voltage distribution of solid state storage elements is performed by reading the solid state storage elements using a variety of read threshold voltages.

5. The read-threshold calibration method in a solid state storage system according to claim 1, further comprising terminating the read-threshold calibration method when the decoding is successful.

6. The read-threshold calibration method in a solid state storage system according to claim 1, wherein the determining a threshold voltage includes selecting the threshold voltage to reduce the number of read errors.

7. A system, comprising:
   solid state storage elements; and
   a storage controller suitable for:
   measuring a threshold voltage distribution of the solid state storage elements;
   locating a first minimum point of the threshold voltage distribution;
   estimating a first optimal read threshold based on the located first minimum point;
   decoding data using the estimated first optimal read threshold;
   wherein, if decoding fails, the storage controller is further suitable for:
   removing an excessive number of minimum points from the threshold voltage distribution by filtering the threshold voltage distribution of the solid state storage elements;
   locating a subsequent minimum point of the filtered threshold voltage distribution;
   estimating a subsequent optimal read threshold based on the located subsequent minimum point; and
   decoding data using the estimated subsequent optimal read threshold.

8. The system according to claim 7, wherein the excessive number of minimum points are removed from the threshold voltage distribution by filtering with a filter length in a range of two to eight.

9. The system according to claim 8, wherein the storage controller is further suitable for changing the filter length if decoding fails.

10. The system according to claim 7, wherein the read-threshold calibrator is suitable for measuring the threshold voltage distribution of solid state storage elements by reading the solid state storage elements using a number of read threshold voltages.

11. The system according to claim 7, wherein the storage controller is further suitable for terminating operation if the decoding is successful.

12. The system according to claim 7, wherein the read-threshold calibrator is suitable for determining the threshold voltage by selecting the threshold voltage to reduce the number of read errors.

13. A computer implemented process for calibrating a read threshold, the computer implemented process being implemented in a non-transitory computer readable storage medium and comprising computer instructions for:
    measuring a threshold voltage distribution of solid state storage elements;
    locating a first minimum point of the threshold voltage distribution;
    estimating a first optimal read threshold based on the located first minimum point;
    decoding data using the estimated first optimal read threshold;
    if decoding fails:
    removing an excessive number of minimum points from the threshold voltage distribution by filtering the threshold voltage distribution of the solid state storage elements;
    locating a subsequent minimum point of the filtered threshold voltage distribution;
    estimating a subsequent optimal read threshold based on the located subsequent minimum point; and
    decoding the data that previously failed to decode using the estimated subsequent optimal read threshold.

14. The computer implemented process according to claim 13, wherein the excessive number of minimum points are removed from the threshold voltage distribution by filtering with a filter length in a range of two to eight.

15. The computer implemented process according to claim 13, wherein the instructions further comprises terminating operation if the decoding is successful.

* * * * *